(12) United States Patent
Kojima

(10) Patent No.: US 7,397,289 B2
(45) Date of Patent: Jul. 8, 2008

(54) SKEW ADJUSTING METHOD, SKEW ADJUSTING APPARATUS, AND TEST APPARATUS

(75) Inventor: Shoji Kojima, Tokyo (JP)

(73) Assignee: Advantest Corporation, Tokyo (JP)

( * ) Notice: Subject to any disclaimer, the term of this patent is extended or adjusted under 35 U.S.C. 154(b) by 65 days.

(21) Appl. No.: 11/501,474

(22) Filed: Aug. 9, 2006

(65) Prior Publication Data

US 2007/0182402 A1 Aug. 9, 2007

Related U.S. Application Data

(63) Continuation of application No. PCT/JP2005/002641, filed on Feb. 18, 2005.

(30) Foreign Application Priority Data

Feb. 19, 2004 (JP) .............................. 2004-043053

(51) Int. Cl.
*H03L 7/00* (2006.01)
(52) U.S. Cl. ........................ 327/161; 327/163; 714/700; 324/765
(58) Field of Classification Search ................. 327/161, 327/163, 162; 714/700; 324/765
See application file for complete search history.

(56) References Cited

U.S. PATENT DOCUMENTS

| 4,247,817 A * | 1/1981 | Heller .......................... 327/63 |
| 4,820,944 A * | 4/1989 | Herlein et al. ............... 327/270 |
| 6,670,830 B2 * | 12/2003 | Otsuka et al. ................. 326/86 |

(Continued)

FOREIGN PATENT DOCUMENTS

JP 57-79536 5/1982

(Continued)

OTHER PUBLICATIONS

International Search Report issued in International application No. PCT/JP2005/002641 mailed on May 31, 2005 and English translation thereof, 4 pages.

(Continued)

*Primary Examiner*—Kenneth B. Wells
(74) *Attorney, Agent, or Firm*—Osha Liang LLP

(57) ABSTRACT

There is provided a skew adjusting apparatus for adjusting a skew between a positive-side differential signal and a negative-side differential signal in differential signals inputted from an outside device via outside transmission lines, having a positive-side transmission line for propagating the positive-side differential signal inputted to an input end, a negative-side transmission line for propagating the negative-side differential signal inputted to an input end, a plurality of differential comparators connected with the positive-side and negative-side transmission paths so that a difference between wiring length from the input end of the positive-side transmission path and wiring length from the input end of the negative-side transmission path is different from each other and that take in the positive-side differential signal and the negative-side differential signal and a selecting section for selecting a signal taken in by the differential comparator by which a skew between the positive-side path from an output terminal of the positive-side differential signal in the outside device to the differential comparator and the negative-side path from an output terminal of the negative-side differential signal in the outside device to the differential comparator is minimized.

14 Claims, 14 Drawing Sheets

U.S. PATENT DOCUMENTS 6,724,182 B2 4/2004 Isodono et al.

FOREIGN PATENT DOCUMENTS

| | | |
|---|---|---|
| JP | 5-66851 | 3/1993 |
| JP | 7-230336 | 8/1995 |
| JP | 2000-304818 | 11/2000 |
| JP | 2000-304848 | 11/2000 |

OTHER PUBLICATIONS

Office Action dated Aug. 30, 2007 issued by the Korean Intellectual Property Office in Application No. 10-2006-7019259, with English translation, 6 pages.

* cited by examiner

US 7,397,289 B2

SKEW ADJUSTING METHOD, SKEW ADJUSTING APPARATUS, AND TEST APPARATUS

CROSS REFERENCE TO RELATED APPLICATION

The present application claims priority from a Japanese Patent Application No. 2004-043053 filed on Feb. 19, 2004, the contents of which are incorporated herein by reference.

BACKGROUND OF THE INVENTION

1. Field of the Invention

The present invention relates to a skew adjusting method, a skew adjusting apparatus and a test apparatus and more specifically to a skew adjusting method, a skew adjusting apparatus and a test apparatus suitable for a semiconductor device test apparatus for testing operations of semiconductor devices that output a differential signal.

2. Related Art

Semiconductor devices having high speed and small amplitude differential interface have come to appear lately. Speed of the device of the highest is as high as several Gbps. In case of such super-high speed differential signal, the differential signal causes a phase difference (hereinafter referred to as skew) when length of two transmission paths of positive and negative is different even a bit and then causes a trouble that test of the semiconductor device cannot be done correctly.

This phenomenon will be explained referring to FIGS. 11 through 13. FIG. 11 shows a semiconductor device-under test 10, a differential comparator 20 and a test fixture 30 (connecting fixture) for electrically connecting the semiconductor device-under test 10 and the differential comparator 20. While the example shown in FIG. 11 shows a case when the semiconductor device-under test 10 is outputting a pair of differential signals, the semiconductor device-under test 10 outputs a large number of pairs of differential signals in reality and each pair of differential signals is applied to the differential comparator 20 provided in the pin electronics 40 for example via the test fixture 30.

The differential signals of positive POS and negative NEG are transmitted to the pin electronics 40 via single transmission lines 31 and 32 in the test fixture 30 and the differential comparator 20 provided in the pin electronics 40 judges whether or not theoretical values of the differential signals have normal logic value L or normal logic value H.

FIG. 12 shows a configuration of the differential comparator 20. The differential comparator 20 adds the differential signals inputted through a pair of input terminals 21a and 21b at an adding circuit 22. Since the differential signal NEG is a signal that has been inverted, the adding circuit 22 adds the differential signals POS and NEG by subtracting the differential signal NEG from the differential signal POS here. Next, the adding circuit 22 applies the added result to voltage comparators 23a and 23b that detect whether or not a response output signal outputted out of the semiconductor device-under test 10 has VIL, i.e., a normal logic value L, and VIH, i.e., a normal logic value H. That is, the voltage comparators 23a and 23b compare the logic value of the added signal outputted out of the adding circuit 22 by the comparative voltages VIH and VIL and output the comparison result by latching by flip-flops 24a and 24b. When the logic value of the added signal is higher than the comparative voltage VIH, the logic L is latched in the flip-flop 24a by a strobe pulse Hstb. When the logic value of the added signal is Lower than the comparative voltage VIL, the logic L is latched in the flip-flop 24b by a strobe pulse Lstb. When the logic value of the added signal is smaller than the VIH and VIL, the differential comparator 20 latches the logic H indicating 'failure' in the flip-flops 24a and 24b and outputs signals F-H and FL indicating 'failure.'

FIG. 13A shows a waveform of the added signal outputted out of the adding circuit 22 and inputted to the voltage comparators 23a and 23b when the differential signals POS and NEG outputted out of the semiconductor device-under test 10 are inputted to the differential comparator 20 in a state when their phases are uniform. The adding circuit 22 executes the operation of inverting the polarity of the negative signal NEG and adding it to the positive signal POS and generates a signal having an amplitude of double of the positive signal POS as a result.

When the positive signal POS and the negative signal NEG inputted to the differential comparator 20 are uniform so as to have the same phase, changes of potential in a process of inverting from the logic L to the logic H for example of the waveform of the added signal outputted out of the adding circuit 22 changes linearly as shown in FIG. 13A. Further, changes of potential in a case of falling from the logic H to the logic L also changes linearly although not shown specifically.

By the way, when there exists even a small difference between the line lengths of the single transmission paths 31 and 32 in the test fixture 30, it causes a skew between the differential signals POS and NEG arriving at the differential comparator 20 and when the adding circuit 22 adds the differential signals POS1 and NEB1 having the skew, its added signal causes break points b1 and b2 in the changes of potential in the inversion process as shown in FIG. 13B. The break points b1 and b2 occur due to that each added value differs in sections D1 and D2 as well as D3 and D4 shown in FIG. 13B. Accordingly, an error ΔT occurs due to the break points b1 and b2 as compared to the case when the timing of crossing with the comparative voltages VIL and VIH to be compared by the voltage comparators 23a and 23b changes linearly and due to the error ΔT, an error occurs when the inversion timing of the semiconductor device-under test 10 is measured. Then, due to the measured error of the inversion timing, a problem occurs in measuring response speed of the device that the measurement cannot be done accurately.

It is noted that because the applicant is unaware of existence of prior art documents at present time, description thereof will be omitted here.

FIG. 14 shows a conventional skew adjusting method for solving this problem. An example shown in FIG. 14 represents a method of inserting a part TB called a trombone into the signal transmission paths to adjust a skew. The trombone TB is what elongates length of the signal transmission paths by a motor (not shown) to allow adjustment of the skew by constructing analog variable delay lines by the elongation of the line length.

This adjustment method allows the skew to be adjusted to an optimum state each time when a phase difference is changed due to changes of connection within the test fixture 30 (wiring within the test fixture 30 is changed every time when types of the semiconductor device-under test 10 is changed). However, such part TB is expensive and its volume is large, so that a large capacity is required to store a large number of trombones TB. Still more, it has had a drawback that it cannot adjust quickly because it operates mechanically.

FIG. 15 also shows another method. FIG. 15 shows a case when the devices within the test fixture 30 are connected by differential lines 33 composed of twisted pair lines.

When the test fixture 30 is made by the differential lines 33 however, there arises a drawback that a phase difference or asymmetry possibly contained in the differential signals outputted out of the semiconductor device-under test 10 are averaged on the way of the transmission paths and that true waveform of the semiconductor device-under test 10 cannot be measured by the differential comparator 20. That is, although it is a feature of the differential lines 33 that the asymmetry of the waveforms is averaged on the way of the transmission path, it is preferable to be able to observe the asymmetry outputted out of the semiconductor device-under test 10 as asymmetry.

It is then necessary to construct the lines within the test fixture 30, by means of separate transmission lines in order to meet this requirement. But, it is impossible to avoid the occurrence of skew, which is caused by the difference in line length as far as these separate transmission lines are used.

SUMMARY OF THE INVENTION

Accordingly, it is an object of the invention to provide a skew adjusting method and a skew adjusting apparatus using the skew adjusting method, which are capable of readily adjusting the skew caused by the length of the lines within the test fixture. This object may be achieved through the combination of features described in independent claims of the invention. Dependent claims thereof specify preferable embodiments of the invention.

According to a first aspect of the invention, there is provided a skew adjusting apparatus for adjusting a skew between a positive-side differential signal and a negative-side differential signal in differential signals inputted from an outside device via outside transmission lines, having a positive-side transmission line for propagating the positive-side differential signal inputted to an input end, a negative-side transmission line for propagating the negative-side differential signal inputted to an input end, a plurality of differential comparators connected with the positive-side and negative-side transmission paths so that a difference between wiring length from the input end of the positive-side transmission path and wiring length from the input end of the negative-side transmission path is different from each other and that take in the positive-side differential signal and the negative-side differential signal and a selecting section for selecting a signal taken in by the differential comparator by which a skew between the positive-side path from an output terminal of the positive-side differential signal in the outside device to the differential comparator and the negative-side path from an output terminal of the negative-side differential signal in the outside device to the differential comparator is minimized.

A plurality of positive-side junctions whose wiring length from the input end differ may be provided on the positive-side transmission line, a plurality of negative-side junctions whose wiring length from the input end differ may be provided on the negative-side transmission line and each of the differential comparators may take in the positive-side differential signal and the negative-side differential signal from either one the positive-side junctions and the negative-side junction corresponding to the positive-side junction.

Each of the plurality of positive-side junctions arrayed in order of those having shorter wiring length from the input end and each of the plurality of negative-side junctions arrayed in order of those having longer wiring length from the input end may correlate in a relationship of 1-to-1 in the order of array, each of the plurality of differential comparators may be connected with the positive-side junction and the negative-side junction and the selecting section may select the differential comparator where the skew becomes least among the plurality of differential comparators to obtain the differential signal by the differential comparator.

The plurality of positive-side junctions and the plurality of negative-side junctions may be provided at predetermined intervals on the positive-side transmission line and on the negative-side transmission line.

The positive-side transmission path and the negative-side transmission path may be provided almost in parallel so as to transmit the positive-side differential signal and the negative-side differential signal in the opposite direction and the corresponding positive-side junction and negative-side junction are provided almost same position in the direction in which the positive-side transmission path and the negative-side transmission path extend.

The selecting section may select the differential comparator where the skew is minimized based on the differential signal obtained by each of the plurality of differential comparators.

The skew adjusting apparatus may further include an adjusting signal output section for inputting an adjusting differential signal to a non-input end of the positive-side transmission line and to a non-input end of the negative-side transmission line and the selecting section may select a set of the positive-side junction and the negative-side junction that minimize the skew based on the adjusting differential signal reflected from end parts to which the outside device in the outside transmission line is to be connected.

The adjusting signal output section may have an adjusting signal generating section for generating an adjusting signal, a positive-side variable delay circuit and a negative-side variable delay circuit for delaying the adjusting signal by desirable time, a positive-side driver for outputting the positive-side adjusting differential signal based on the adjusting signal delayed by the positive-side variable delay circuit, a negative-side driver for outputting the negative-side adjusting differential signal based on the adjusting signal delayed by the negative-side variable delay circuit and a delay adjusting section for adjusting a value of delay of the positive-side variable delay circuit and the negative-side variable delay circuit based on a result when the positive-side adjusting differential signal and the negative-side adjusting differential signal based on the adjusting signal are taken in by the differential comparator where the wiring length from the positive-side driver is almost equal with the wiring length from the negative-side driver.

According to a second aspect of the invention, there is provided a skew adjusting method for adjusting a skew between a positive-side differential signal and a negative-side differential signal in differential signals inputted from an outside device via outside transmission lines, having a step of positive-side transmission for propagating the positive-side differential signal inputted to an input end by a positive-side transmission line, a step of negative-side transmission for propagating the negative-side differential signal inputted to an input end by a negative-side transmission line, a step of taking in the positive-side differential signal and the negative-side differential signal by a plurality of differential comparators connected with the positive-side and negative-side transmission paths so that a difference between wiring length from the input end of the positive-side transmission path and wiring length from the input end of the negative-side transmission path is different from each other and a step of selection for selecting a signal taken in by the differential comparator by which a skew between the positive-side path from an output terminal of the positive-side differential signal in the outside device to the differential comparator and the negative-side path from an output terminal of the negative-side differential signal in the outside device to the differential comparator is minimized.

The selection step may include a step of inputting an adjusting differential signal substantially having no skew between the positive-side differential signal and the negative-side differential signal to end parts to which the outside device in the outside transmission line is to be connected and a step of selecting the differential comparator where the skew becomes least based on the adjusting differential signal obtained by each of the plurality of differential comparators.

The skew adjusting method may further include a adjusting signal outputting step for inputting the adjusting differential signal to a non-input end of the positive-side transmission line and to a non-input end of the negative-side transmission line in a state in which the outside device is not connected with the outside transmission lines and a set of the positive-side junction and the negative-side junction that minimize the skew may be selected in the selection step based on the adjusting differential signal reflected from the end parts to which the outside device in the outside transmission line is to be connected.

According to a third aspect of the invention, there is provided a test apparatus for testing a semiconductor device-under test, having a pattern generator for generating a test pattern of the semiconductor device-under test, a waveform shaper for generating a test signal to be supplied to the semiconductor device-under test by forming the test pattern, a signal output section for supplying the test signal to the semiconductor device-under test, a skew adjusting section for inputting differential signals outputted out of the semiconductor device-under test via transmission lines to adjust a skew between a positive-side differential signal and a negative-side differential signal in the differential signal and a judging section for judging whether the semiconductor device-under test is defect-free based on the differential signal inputted by the skew adjusting section, and the skew adjusting section includes a positive-side transmission line for propagating the positive-side differential signal inputted to the input end, a negative-side transmission line for propagating the negative-side differential signal inputted to the input end, a plurality of differential comparators that is connected to the positive-side and negative-side transmission paths so that a difference between the wiring length from the input end of the positive-side transmission path and the wiring length from the input end of the negative-side transmission path is different from each other and that takes in the positive-side differential signal and the negative-side differential signal and a selecting section for selecting a signal taken in by the differential comparator where the skew between the negative-side path from an output terminal of the positive-side differential signal in the semiconductor device-under test to the differential comparator and the negative-side path from the output end of the negative-side differential signal in the outside device to the differential comparator is minimized.

According to a fourth aspect of the invention, there is provided a skew adjusting method and a skew adjusting apparatus using the adjusting method in which two delay lines to which differential signals outputted out of a semiconductor device-under test are applied, a plurality of junctions in ascending order in which delay time of the differential signals increases in ascending order from the apply point is provided on one of the two delay lines, a plurality of junctions in descending order for taking out differential signals in which delay time of the differential signals decreases in descending order from the apply point, a plurality of differential comparators for taking in the differential signal from each one of the plurality of junctions in ascending order and the plurality of junctions in descending order correlated from each other and a differential signal having an adequate phase is extracted from the set of these plurality of junctions in the ascending order and the plurality of junctions in the descending order.

It is noted that the summary of the invention described above does not necessarily describe all necessary features of the invention. The invention may also be a sub-combination of the features described above.

The invention can provide the skew adjusting apparatus and the skew adjusting method that allow the adjustment of skew to be carried out simply at low cost.

DETAILED DESCRIPTION OF THE INVENTION

The invention will now be described based on preferred embodiments, which do not intend to limit the scope of the invention, but exemplify the invention. All of the features and the combinations thereof described in the embodiments are not necessarily essential to the invention.

Figure 1:
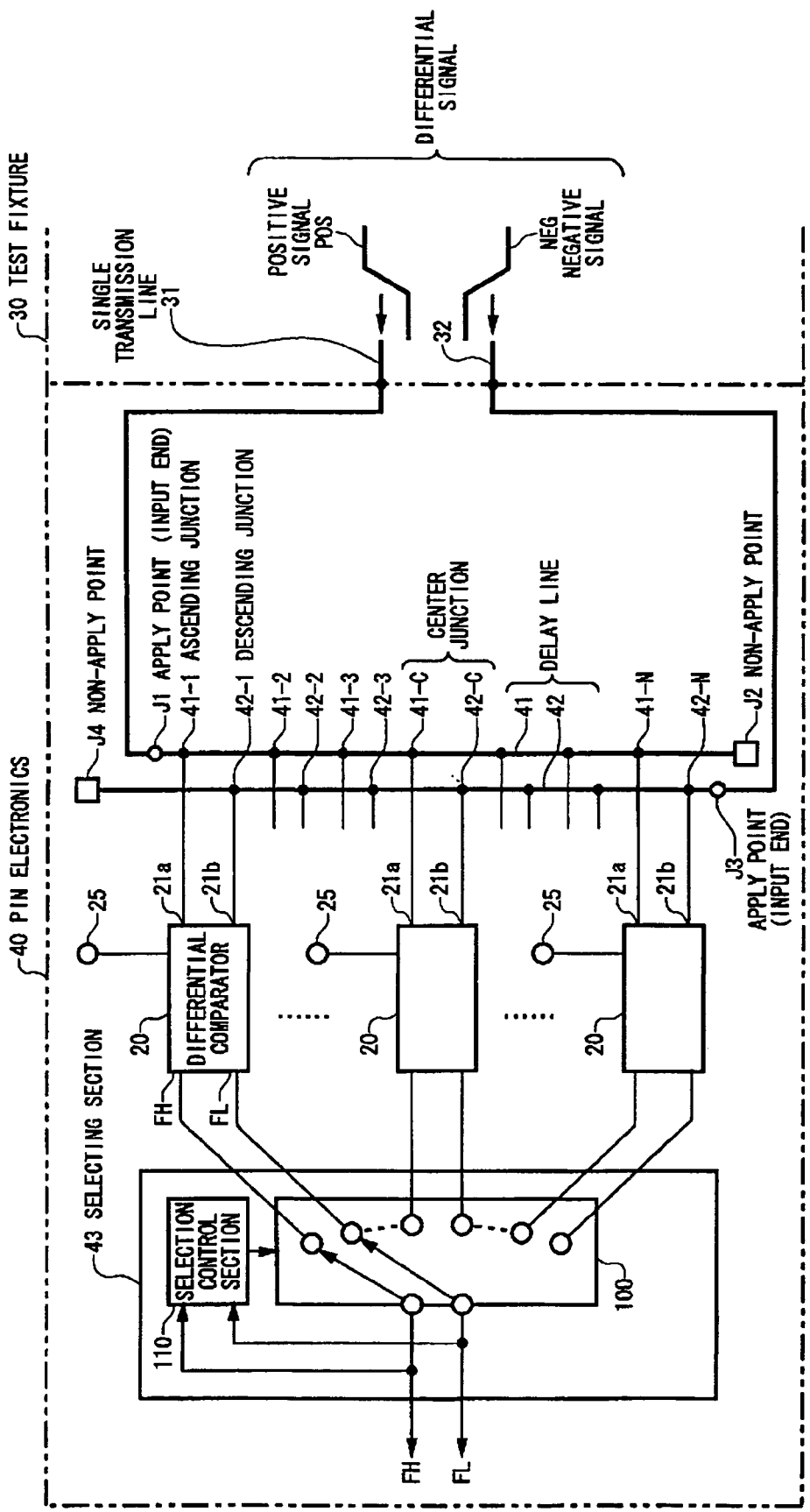
FIG. 1 is a diagram of connection for explaining the best mode for carrying out the invention.

FIG. 1 shows a mode for explaining a skew adjusting method and a skew adjusting apparatus using the skew adjusting method of a mode for carrying out the invention.

The skew adjusting apparatus of the present mode is mounted on a pin electronics 40 and adjusts a skew between a positive-side differential signal and a negative-side differential interface in differential signals inputted via external transmission paths such as single transmission paths 31 from an outside device such as a semiconductor device-under test 10. The skew adjusting apparatus of the present mode has two delay lines 41 and 42, a plurality of differential comparators 20 and a selecting section 43.

The delay line 41 is one example of the positive-side transmission line of the invention and propagates a positive-side differential signal inputted via an input terminal. The delay line 42 is one example of the negative-side transmission line of the invention and propagates a negative-side differential signal inputted via an input terminal. A plurality of positive-side junctions whose wiring lengths from the input end are different are provided on the delay line 41. Still more, a plurality of negative-side junctions whose wiring lengths from the input end are different are provided on the delay line 42. More specifically, an apply point J1 that is the input terminal for inputting the differential signal from the outside device is provided on one end of the delay line 41 and a non-apply point J2 that is a non-input terminal for inputting no differential signal from the outside device is provided on another end. In the same manner, an apply point J3 that is an input terminal for inputting the differential signal from the outside device is provided on one end of the delay line 42 and a non-apply point J4 that is a non-input terminal for inputting no differential signal from the outside terminal is provided on another end. Then, ascending junctions 41-1, 41-2, . . . 41-C, . . . 41-N that are positive-side junctions from which the differential signals whose delay time change gradually in ascending order can be taken out are provided per predetermined distance from the apply point J1 of the delay line 41. Thus, the plurality of ascending junctions 41-1 through 41-N are provided on the delay line 41 at predetermined intervals.

Still more, descending junctions 42-1, 42-2, . . . 42-C, . . . 42-N that are negative-side junctions from which the differential signals whose delay time change gradually in descending order can be taken out are provided per predetermined distance from the non-apply point J4 of the delay line 42. Thus, the plurality of descending junctions 42-1 through 42-N are provided on the delay line 42 at predetermined intervals.

The plurality of differential comparators 20 is connected with the delay lines 41 and 42 so that a different between the wiring length from the input end of the delay line 41 and the wiring length from the input end of the delay line 42 is different from each other and takes in the positive-side differential signal and the negative-side differential signal. More specifically, the plurality of differential comparators 20 is connected respectively with a pair of junctions of the ascending junctions 41-1 through 41-N and the descending junctions 42-1 through 42-N and takes in the differential signals obtained at the respective junction pairs (41-1, 42-1), (41-2, 42-2), (41-C, 42-C) and (41-N, 42-N). It is then judged whether or not the signals outputted out of the semiconductor device-under test (not shown in FIG. 1) have the normal logic value L and logic value H.

That is each of the plurality of ascending junctions 41-1 through 41-N arrayed in order of what has shorter wiring length from the input end of the delay line 41 and each of the plurality of descending junctions 42-1 through 42-N arrayed in order of what has longer wiring length from the input end of the delay line 42 correlate in a relationship of 1-to-1 in the order of array in the present embodiment. Then, each of the plurality of differential comparators 20 is connected so as to take in the positive-side differential signal and the negative-side differential signal from either one ascending junction 41-k and the descending junction 42-k corresponding to the ascending junction 41-k.

Instead of that, each differential comparator 20 may be connected with the delay lines 41 and 42 so that a difference between the wiring length from the input end of the delay line 41 and the wiring length from the input end of the delay line 42 differs from each other by connecting with either one of the ascending junctions 41-1 through 41-N and the same descending junction 42-1 and the like.

The selecting section 43 selects the output of the differential comparator 20, among the plurality of differential comparators 20, to be used as a detecting signal. The selecting section 43 of the present embodiment selects a signal taken in by the differential comparator 20 at position where a skew between the positive-side path from an output terminal of the outside device to the differential comparator 20 and the negative-side path from the output terminal of the outside device to the differential comparator 20 is minimized. Then, the selecting section 43 outputs a signal waveform based on the differential signal obtained by the differential comparator 20.

The selecting section 43 has a selector 100 and a selection control section 110. The selector 100 selects a signal from either one differential comparator 20 based on an instruction from the selection control section 110 and outputs it. The selection control section 110 determines the differential comparator 20 by which the skew is minimized based on the differential signals obtained by the plurality of respective differential comparators 20 and instructs the selector 100 so as to select the signal from that differential comparator 20.

Transmission lines whose impedance characteristics are matched to high frequency signals such as a micro-strip line for example may be used for the two delay lines 41 and 42 in the case described above. A set of single transmission paths 31 and 32, that are an example of an outside transmission path of the invention and wired in the test fixture 30, are connected to the respective ends of the two delay lines 41 and 42 and the apply point J1 and the non-apply point J4 of the differential signal are provided at each end. The j1 and the non-apply point J4 are provided at almost same end position for example. That is, the delay lines 41 and 42 are provided almost in parallel from each other so as to transmit the positive-side differential signal and the negative-side differential signal in the opposite direction. Then, the respective corresponding ascending junction 41-k and descending junction 42-k are provided at almost same position in the direction in which the positive-side transmission path and the negative-side transmission path extend.

Then, delay time gradually increases per every predetermined distance from the aspect of the apply point J1 side by connecting as described above. That is, it is possible to set the ascending junctions 41-1, 41-2, . . . 41-C . . . 41-N from which the differential signals whose delay time change in the ascending order may be obtained.

Still more, delay time gradually decreases per every predetermined distance from the aspect of the non-apply point J4 side. That is, it is possible to set the descending junctions 42-1, 42-2, . . . 42-C . . . 42-N from which the differential signals whose delay time change in the descending order may be obtained.

Here, the junctions 41-C and 42-C provided at the center of the delay lines 41 and 42 will be called specifically as center junctions.

Figure 2:
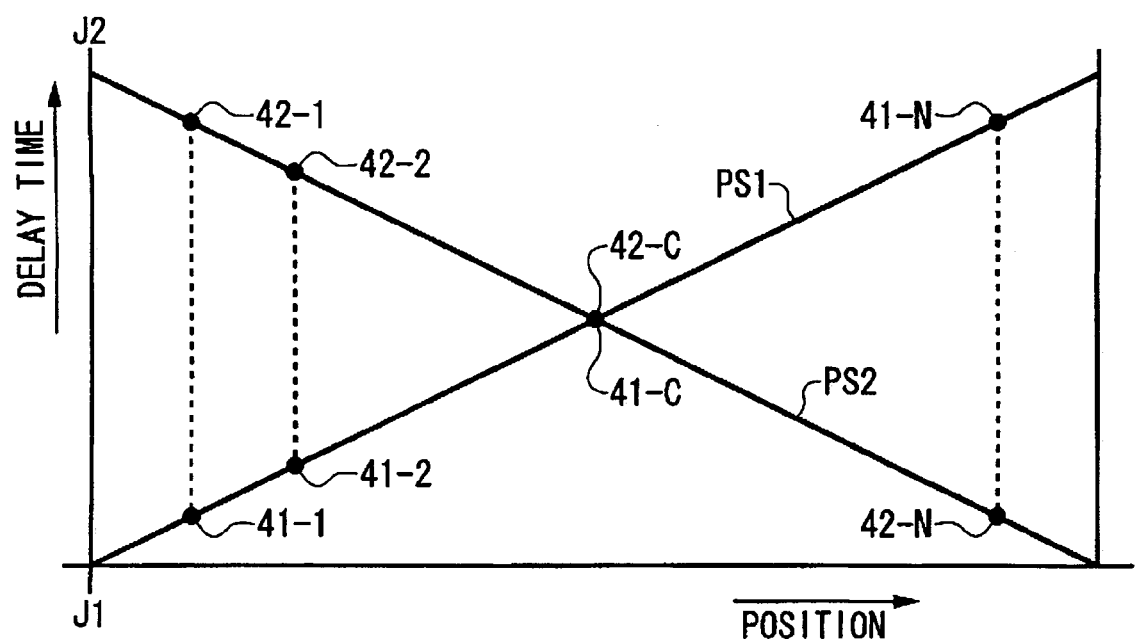
FIG. 2 is a graph for explaining operations of the mode shown in FIG. 1.

FIG. 2 shows a relationship of each delay time of the junction provided on the delay lines 41 and 42. A curve PSI represents the delay time of the differential signals obtained at the ascending junctions 41-1, 41-2, . . . 41-C . . . 41-N provided on the delay line 41. A curve PS2 represents the delay time of the differential signals obtained at the descending junctions 42-1, 42-2, . . . 42-C . . . 42-N provided on the delay line 42. As it is apparent from FIG. 2, the delay time of the differential signals obtained at the center junctions 41-C and 42-C is equal and a relationship of advancement and delay of the phase of the delay lines 41 and 42 is inverted bordering at the center junctions 41-C and 42-C.

As a result, when the phases of the differential signals applied to the delay lines 41 and 42 by passing through the test fixture 30 are identical, the differential comparator 20 comparing the differential signals taken out of the center junctions 41-C and 42-C may be selected.

When the differential signal applied to the delay line 41, i.e., the positive signal POS in the example shown in FIG. 1, has a phase delayed from the negative signal NEG, the phase of the positive signal POS may be corrected to the advanced phase side by taking out the differential signal from the junction at the position leaned toward the apply point J1 side and the negative signal NEG is corrected to the delayed phase side. It is thus possible to correct the relationship of the positive signal POS and the negative signal NEG to adequate one by appropriately selecting the position of the junctions.

When the phase of the positive signal POS is advanced and the phase of the negative signal NEG is delayed in contrary, it is possible to correct the positive signal POS as a delayed phase and the negative signal NEG to an advanced phase as it is apparent from FIG. 2 by selecting the differential signals obtained at the junctions to the terminal side (on the side close to the junctions 41-N, 42-N) from the position of the center junctions 41-C and 42-C. It is thus possible to match the phases of the positive signal POS and the negative signal NEG as an identical phase by adequately selecting the position of the junction.

Figure 3:
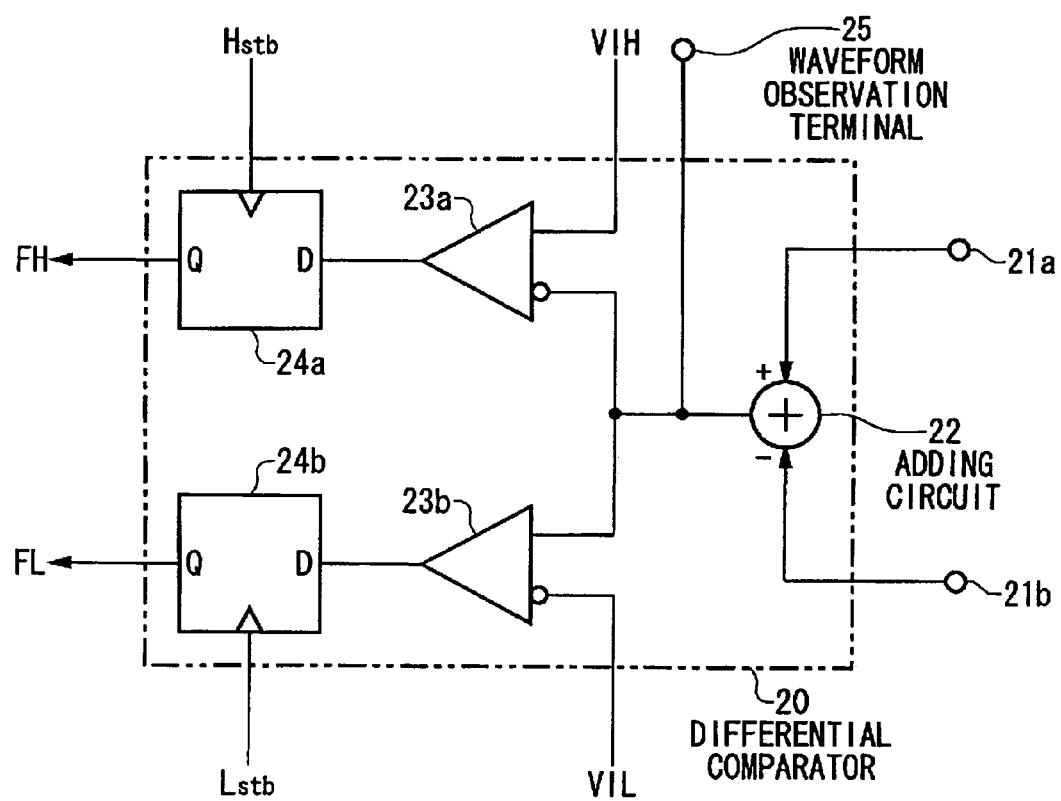
FIG. 3 is a diagram of connection for explaining details of a differential comparator shown in FIG. 1.
Figure 13:
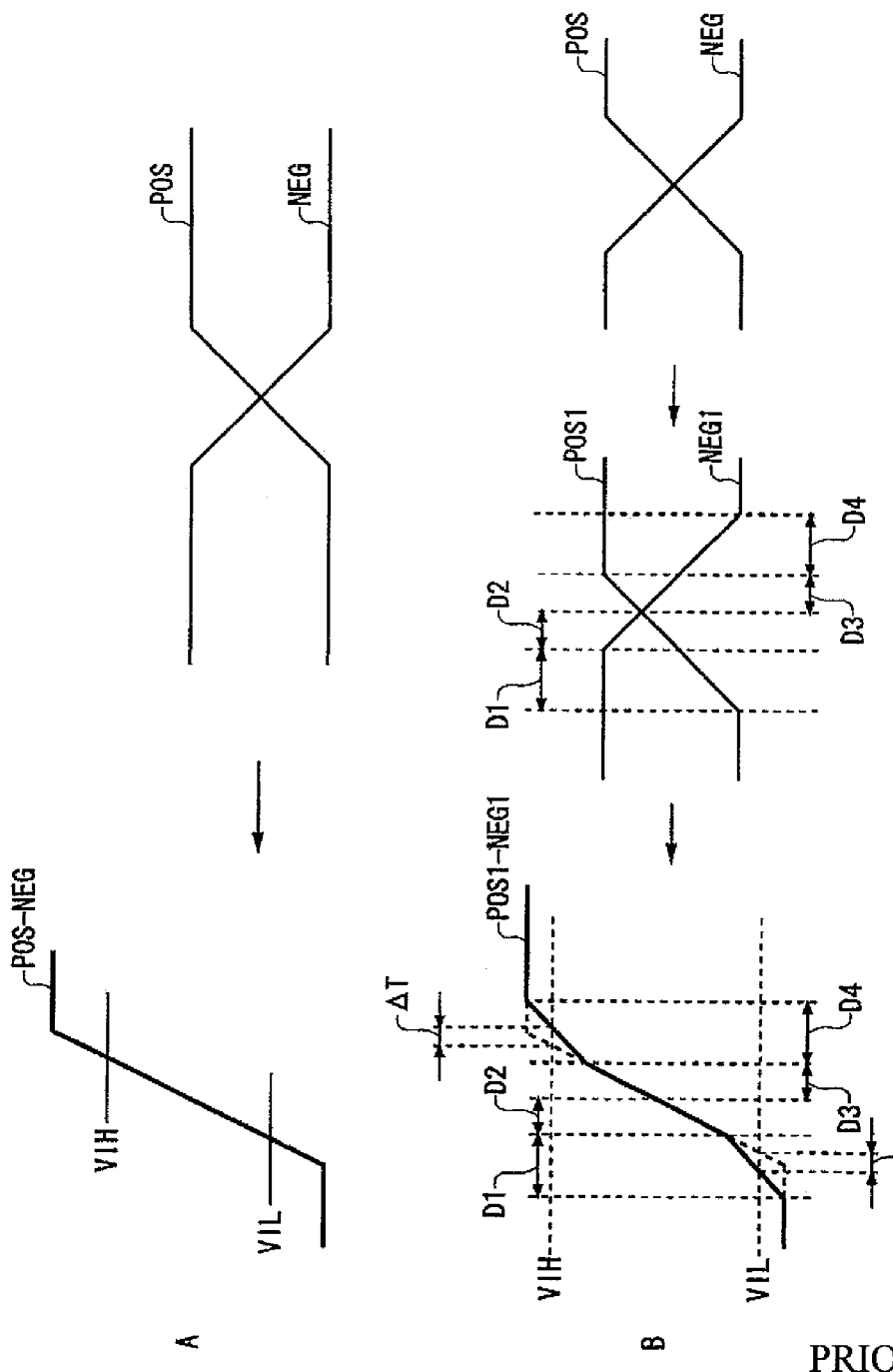
FIG. 13 is a waveform chart for explaining operations of the differential comparator shown in FIG. 12.
Figure 14:
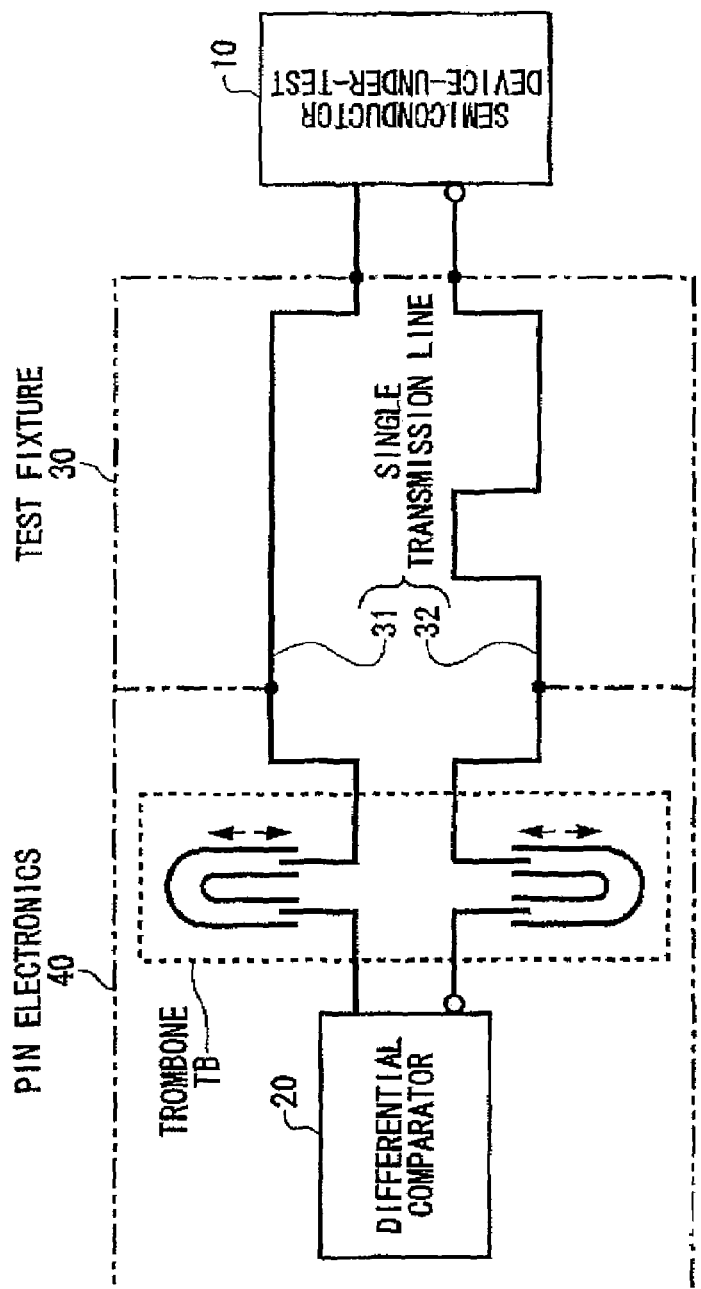
FIG. 14 is a block diagram for explaining the prior art.
Figure 15:
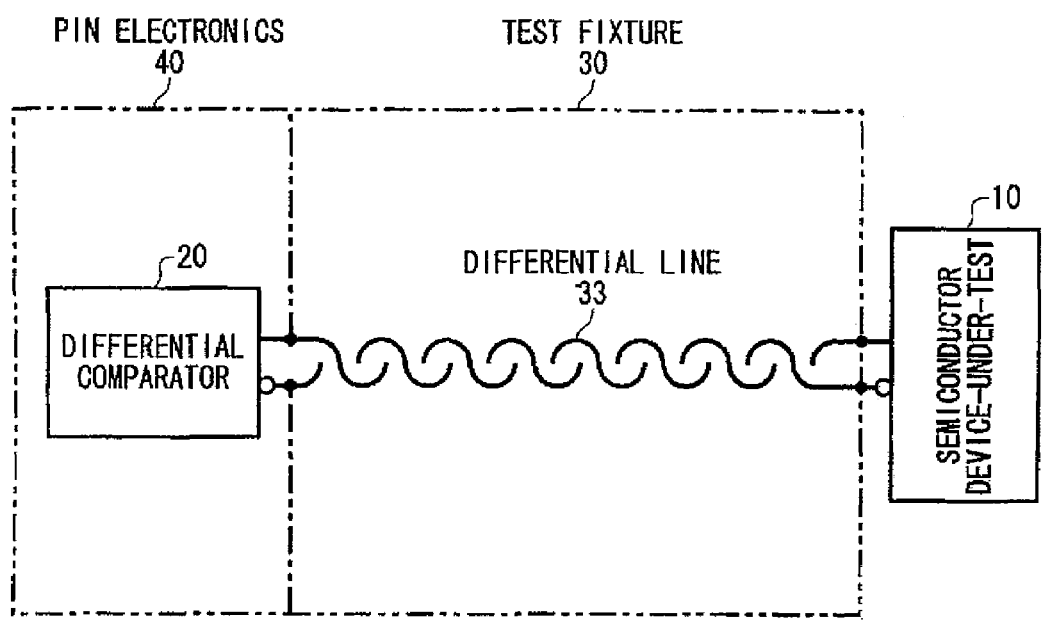
FIG. 15 is a block diagram for explaining another example of the prior art.

The embodiment shown in FIG. 1 shows a case when a waveform observation terminal 25 is provided in each differential comparator 20 in order to judge whether or not the phases of the positive signal POS and the negative signal NEG are matched. As shown in FIG. 3, the waveform observation terminal 25 is led as a terminal for taking out the output signal of the adding circuit 22. It is possible to judge that the positive signal POS and the negative signal NEP having the identical phase are supplied to the differential comparator 20 by observing a waveform outputted out of the waveform observation terminal 25 whether or not the waveform causes a break point (see FIG. 13) in inverting from logic L to logic H and from logic H to logic L and by specifying the differential comparator 20 that causes no break point. Accordingly, the setting of the selector 100 within the selecting section 43 may be carried out from the result of judgment.

Instead of that, it is also possible to almost uniform the phases of the positive signal POS and the negative signal NEG in the differential comparator 20 by selecting the differential comparator 20 that minimizes a rise time and a fall time of the output signal of the adding circuit 22. It is because ΔT in FIG. 13B is minimized if the rise time or fall time is minimum and the differential comparator 20 that causes almost no break point is selected.

It is noted that there is a method of using a waveform observing function of a semiconductor test apparatus as a method for judging whether or not a break point occurs in the added signal of the adding circuit 22. In order to simplify the explanation here, first through third embodiments will be explained as what having the waveform observation terminal 25 provided in the differential comparator 20, observing the output waveform of the adding circuit 22 by using the waveform observation terminal 25 and judging whether or not the phases of the differential signals taken out of the delay lines 41 and 42 coincide. The case when the selection control section 110 determines to select a signal from which differential comparator 20 will be explained in fifth and sixth embodiments.

The skew adjusting apparatus of the present embodiment is capable of adjusting the skew to the correct condition even if the relationship of the phases of the positive signal POS and the negative signal NEG are in any condition of advancement or delay. Accordingly, it is possible to take in the differential signals outputted out of the object to be measured without shifting the phases on the positive-side and negative-side and to provide a test apparatus that adequately test the differential signals outputted out of the outside device.

First Embodiment

Figure 4:
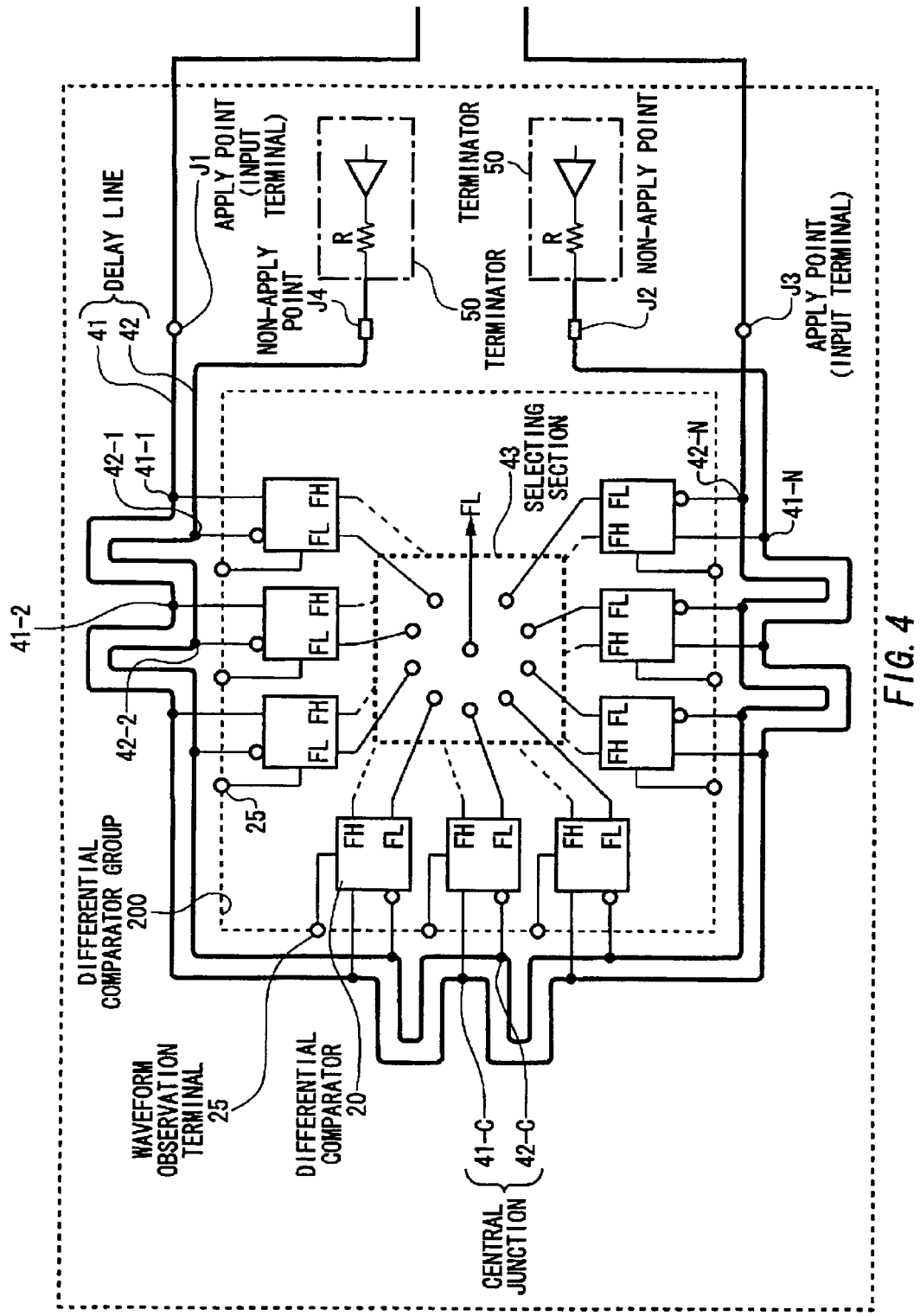
FIG. 4 is a diagram of connection for explaining a first embodiment of the invention.

FIG. 4 shows a first embodiment of the invention. This embodiment presents a case when the two delay lines 41 and 42 in parallel in a shape of ring and the differential comparator group 200 is disposed inside of the ring. Still more, the first embodiment presents a case when the differential comparator group 200 is implemented as an IC and the differential comparator group 200 is constructed in one semiconductor chip. Still more, while the selecting section 43 is presented by rotary switches in this case, the rotary switches are composed of analog switches and the like composed of AND circuits or the semiconductor and are mounted within the IC. It is noted that although FIG. 4 shows only the selecting section 43 that selects one judgment output of the differential comparator 20, it is actually constructed so as to select and to take out the both of two judgment results outputted out of the differential comparator 20. Still more, FIG. 4 shows a case constructed so as to connect terminators 50 each terminal of the delay lines 41 and 42 to terminate at terminal resistors R in a state when predetermined potential is given to the terminal of each of the delay circuits 41 and 42. It is also constructed so that the waveform observation terminal 25 is led out of each differential comparator 20 mounted in the differential comparator group 200 as an outside pin of the IC and so that the waveform of the added signal may be observed from the outside.

The relationship of advancement and delay of the phases of the differential signals taken out before and after the center junctions 41-C and 42-C centering on them is reversed also in this embodiment and the skew adjusting apparatus can adjust the skew even if the phase of one of the differential signals is advanced or delayed to the correct relationship of phases.

Second Embodiment

Figure 5:
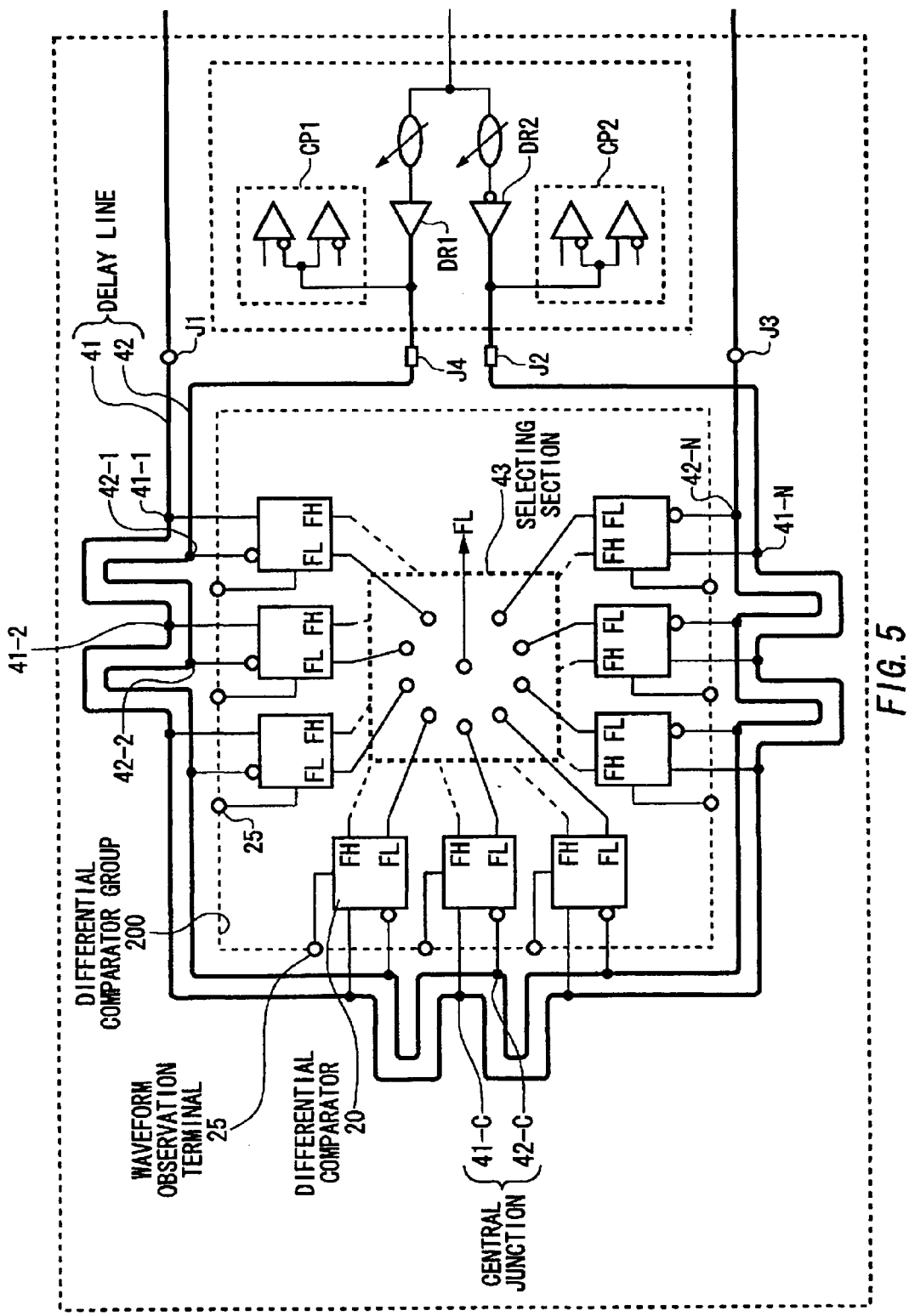
FIG. 5 is a diagram of connection for explaining a second embodiment of the invention.

FIG. 5 shows a second embodiment of the invention. This embodiment presents a case when drivers DR1 and DR2 are connected to each terminal of the delay lines 41 and 42 so as to be able to feed differential type input signals to the semiconductor device-under test 10. It is noted that in this case, comparators CP1 and CP2 for judging a logic value of a single mode signal (used when the semiconductor device-under test 10 outputs a single mode signal) may be connected to the output ends of the drivers DR1 and DR2.

The other configuration is the same with the first embodiment explained in connection with FIG. 4, so that further explanation will be omitted here.

Third Embodiment

Figure 6:
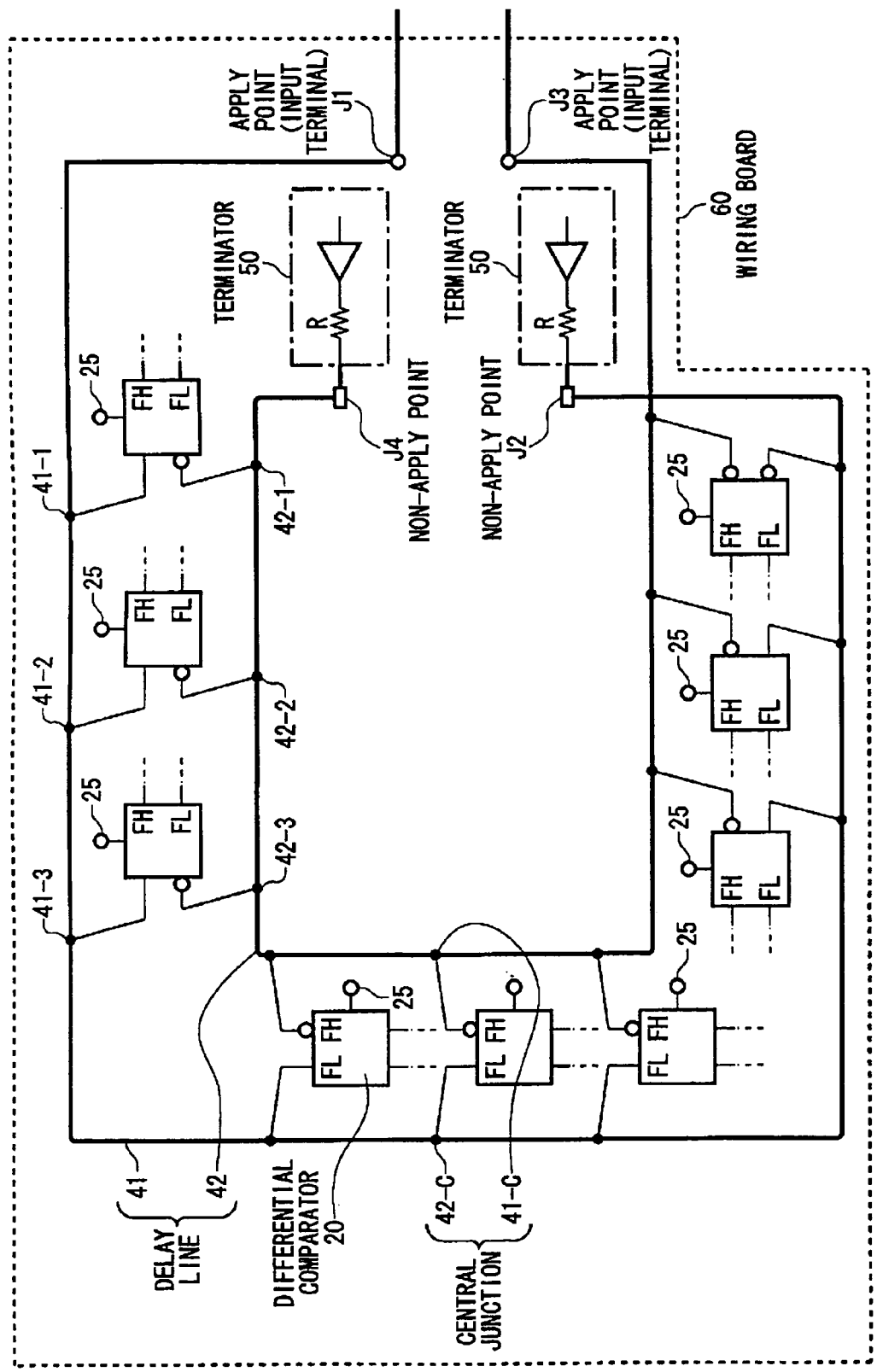
FIG. 6 is a diagram of connection for explaining a third embodiment of the invention.

FIG. 6 shows a third embodiment of the invention. The present embodiment presents a case when the differential comparators 20 are constructed by different chips. That is, the delay lines 41 and 42 are formed in parallel in a shape of ring on a wiring board 60 and the chips composing the differential comparators 20 are mounted between these delay lines 41 and 42 and input terminals of the differential comparator of each chip are connected with the ascending junctions 41-1, 41-2, . . . 41-C . . . 41-N and the descending junctions 42-1, 42-2, . . . 42-C . . . 42-N provided on the delay lines 41 and 42 by means of printed conductors. It is noted that FIG. 6 shows by omitting the selecting section 43.

It is possible to obtain the differential signals to which the identical delay time is given at the center junctions 41-C and 42-C, to reverse the relationship delay time given to the differential signals bordering at the center junctions and to adjust the skew correctly even if the phase of either one of the positive signal and negative signal is advanced or delayed also in this case.

Fourth Embodiment

Figure 7:
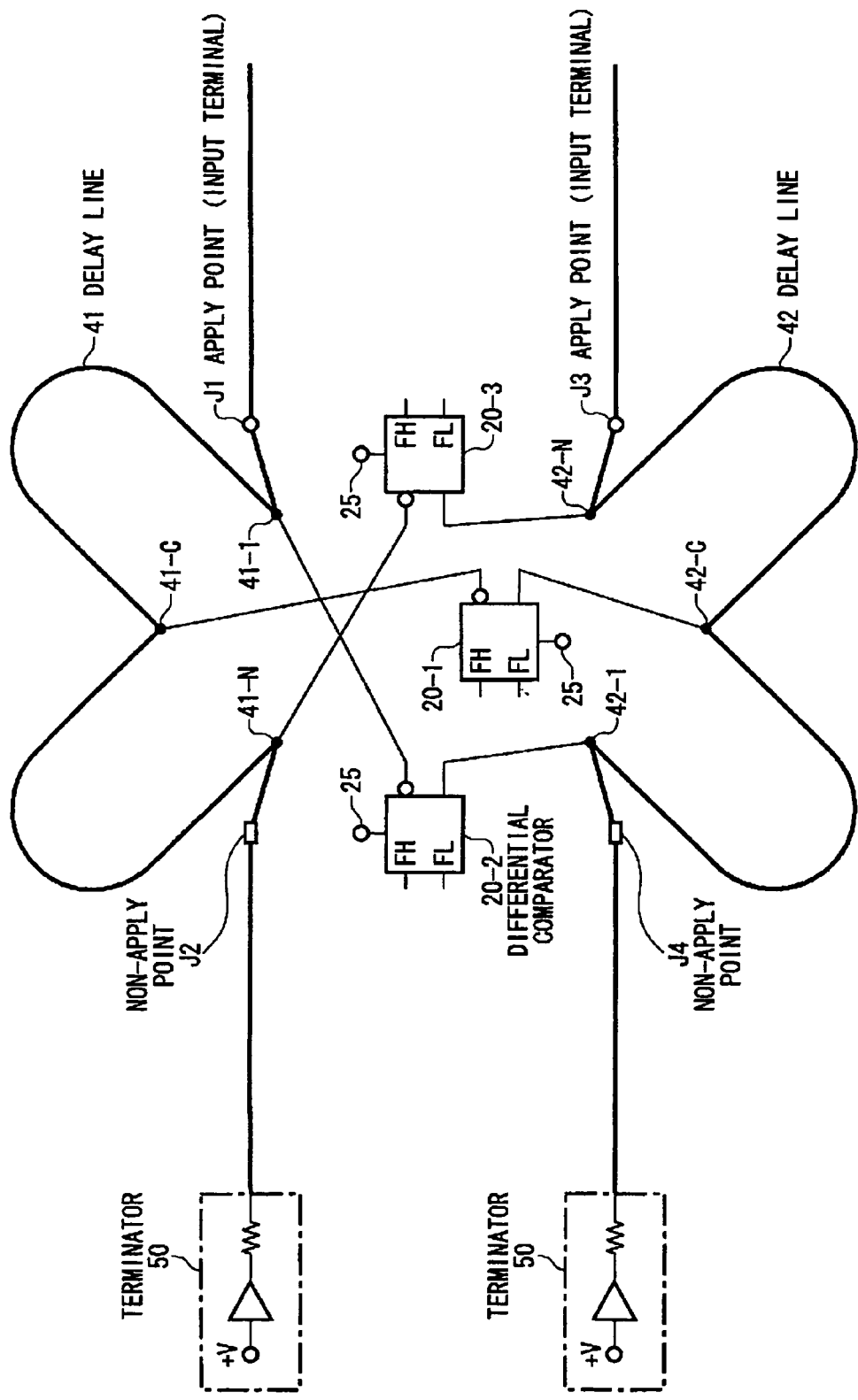
FIG. 7 is a diagram of connection for explaining a fourth embodiment of the invention.

FIG. 7 shows a fourth embodiment of the invention. The present embodiment presents a case when the delay lines 41 and 42 are disposed not in parallel. In this case, a differential comparator 20-1 whose input points are the center junctions 41-C and 42-C, a differential comparator 20-2 whose input points are a junction 41-1 that is closest to the apply point J1 and a junction 42-1 closest to the non-apply point J4 and a differential comparator 20-3 whose input points are a junction 42-N closest to the apply point of the delay line 42 and a junction 41-N closest to the non-apply point of the delay line 41 are provided and the adjustment of skew is carried out by selecting either one of these differential comparators 20-1, 20-2 and 20-3. The selecting section 43 is omitted also in this case.

The configuration shown in FIG. 7 is also capable of adjusting the skew with good resolution by providing a number of junctions and a number of differential comparators corresponding to the number of the junctions.

Fifth Embodiment

A fifth embodiment presents a method for adjusting the skew adjusting apparatus of the first through fourth embodiments itself.

Figure 8:
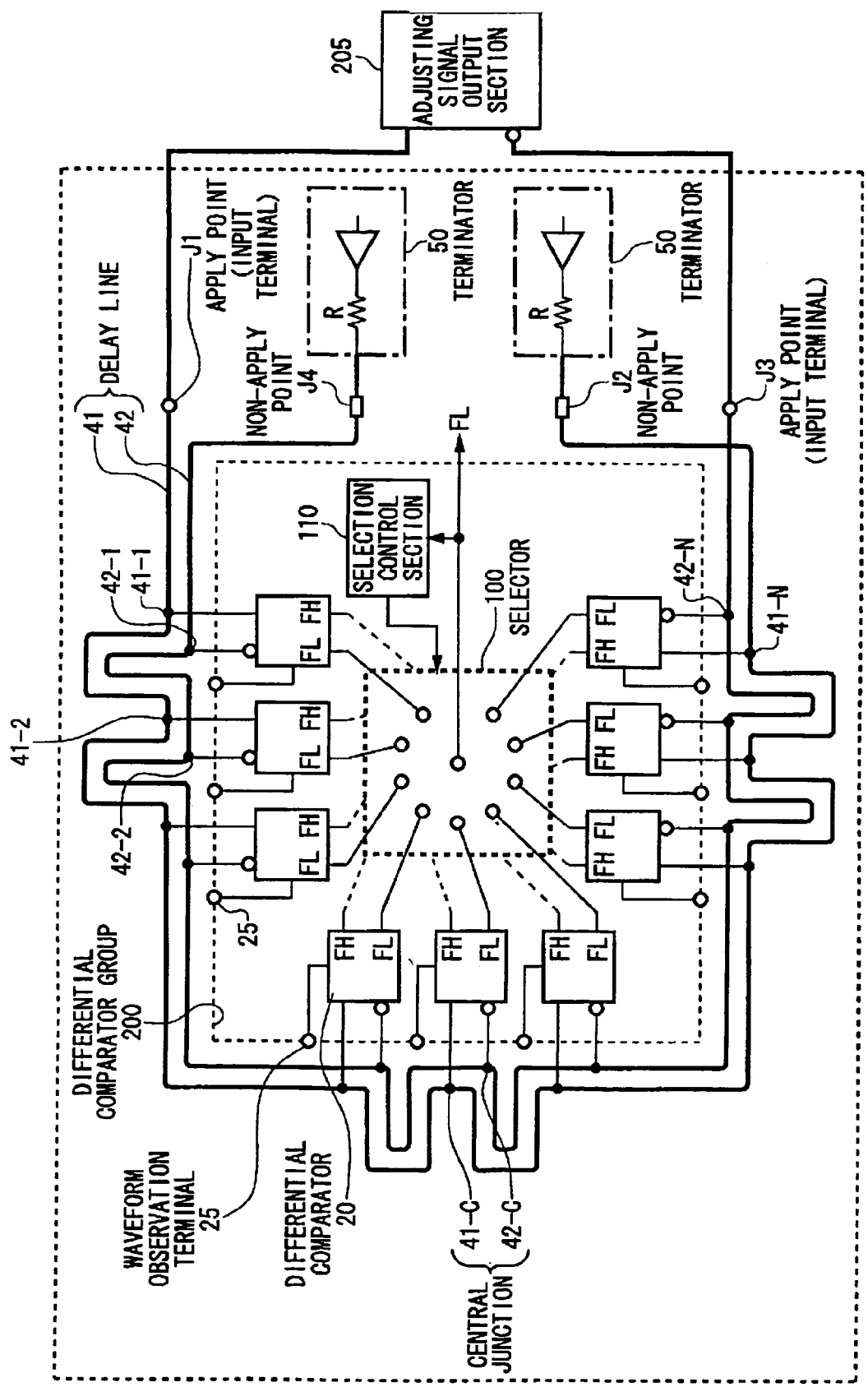
FIG. 8 is a diagram of connection for explaining a fifth embodiment of the invention.

FIG. 8 shows a configuration for adjusting the skew adjusting apparatus shown in FIG. 4 for example. In FIG. 8, parts denoted by the same reference numerals with those in FIG. 4 have the same function and configuration with those in FIG. 4, so that their explanation will be omitted here, except of their differences.

The single transmission line is used for each of the positive-side and negative-side as the outside transmission lines between the outside device to be measured and the input ends of the delay lines 41 and 42 as described above. Therefore, the length of the transmission lines may differ on the positive-side and the negative-side. Accordingly, the skew adjusting apparatus corrects the skew by the skew adjusting method so as to be able to take in the positive-side differential signal and the negative-side differential signal outputted out of the outside device almost identical relative phases.

In the skew adjusting method, an adjusting signal output section 205 is connected with end parts to which the outside device in an outside transmission line is to be connected at first. In the present embodiment, the adjusting signal output section 205 can output a signal substantially having no skew between the positive-side differential signal and the negative-side differential signal as an adjusting differential signal of the skew adjusting apparatus.

Next, as a first step of a selection step for selecting either one differential comparator 20, the above-mentioned adjusting differential signal substantially having no skew between the positive-side differential signal and the negative-side differential signal is inputted to the end parts to which the outside device is to be connected in the outside transmission line. Then, as a second step of the selection step, the differential comparator 20 where the skew becomes least based on the adjusting differential signal obtained by each of the plurality of differential comparators 20.

More specifically, the selection control section 110 of the present embodiment sequentially selects each differential comparator 20 to input a detection signal outputted out of the differential comparator 20 and determines the differential comparator 20 where the skew between the positive-side path from the output terminal of the positive-side differential signal in the outside device to the differential comparator 20 and the negative-side path from the output terminal of the negative-side differential signal in the outside device to the differential comparator 20 becomes least based on the detection signal. For example, the selection control section 110 may determine the differential comparator 20 where the rise time or fall time of the output signal of the waveform observation terminal 25 becomes least as the differential comparator 20 where the skew becomes least. As an example, the selection control section 110 may determine the differential comparator 20 where a time difference between timing of change of a signal FL and change of timing of a signal FH becomes least as the differential comparator 20.

Then, the selection control section 110 sets the selector 100 so as to select the signal taken in by the differential comparator 20.

Thus, the skew adjusting apparatus can select the differential comparator 20 that minimizes the skew generated in the outside transmission lines used for connecting the outside device and the input ends of the delay lines 41 and 42. Then, the outside device to be measured is connected in place of the adjusting signal output section 205 to cause the differential signals inputted from the apparatus to propagate through the delay lines 41 and 42. Then, it causes the plurality of differential comparators 20 to take in the positive-side and negative-side differential signals and to output the detection signal to select the detection signal from the selected differential comparator 20. Thereby, the skew adjusting apparatus can minimize the skew of the path from the output end of the outside device to the differential comparator 20 and can adequately measure the differential signals outputted out of the apparatus.

Sixth Embodiment

A sixth embodiment presents a modified example of the method for adjusting the skew adjusting apparatus of the first through fourth embodiments itself.

Figure 9:
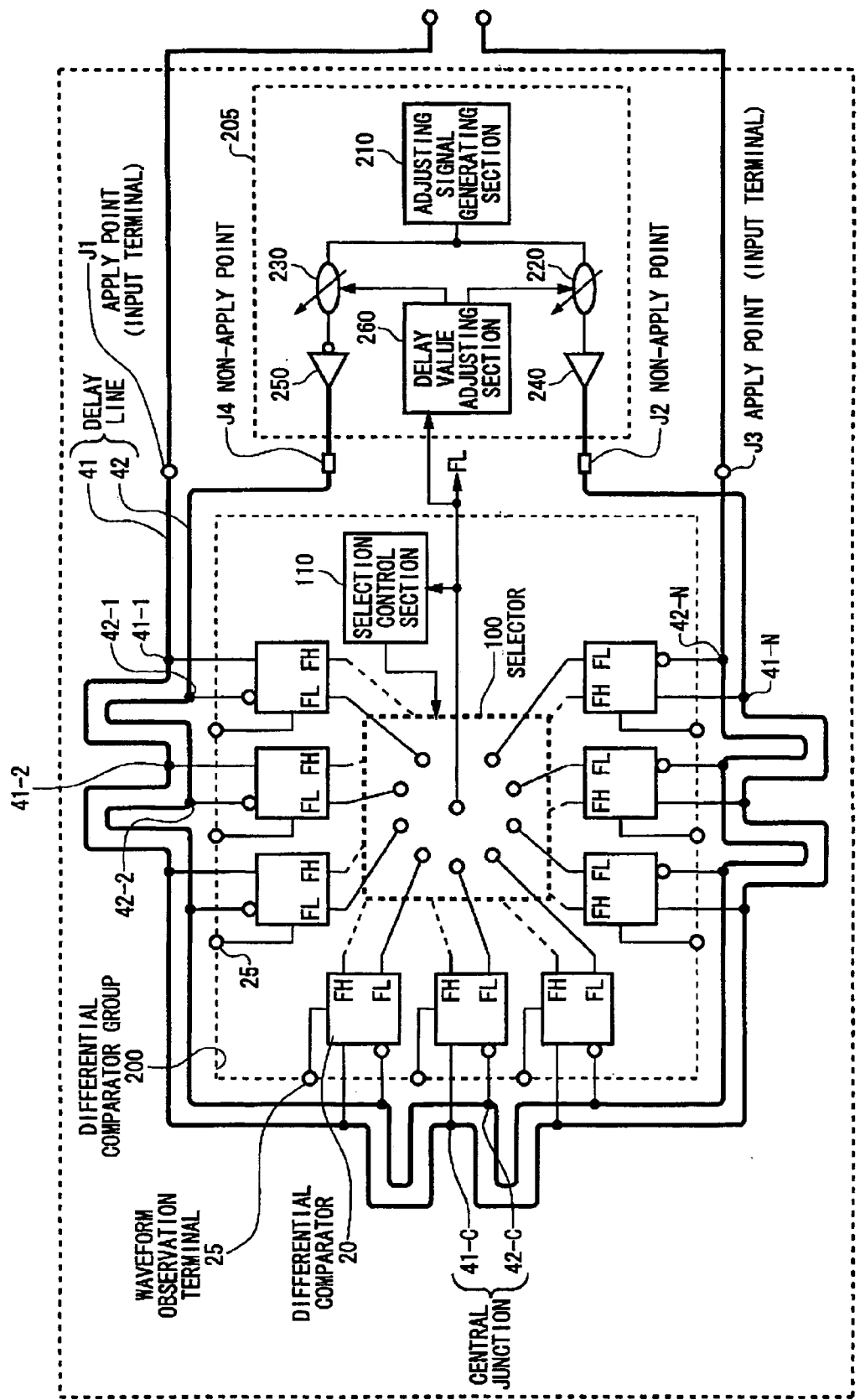
FIG. 9 is a diagram of connection for explaining a fifth embodiment of the invention.

FIG. 9 shows a configuration for adjusting the skew adjusting apparatus shown in FIG. 4 as an example. In FIG. 9, parts denoted by the same reference numerals with those in FIG. 4 has the same function and configuration with those in FIG. 4, so that their explanation will be omitted here, except of their differences.

As shown in the fifth embodiment, length of the outside transmission lines between the outside device to be measured and the skew adjusting apparatus may differ on the positive-side and negative-side. Accordingly, the skew adjusting apparatus corrects the skew by this skew adjusting method so as to be able to take in the positive-side differential signal and the negative-side differential signal outputted out of the outside device with almost identical relative phases.

The skew adjusting apparatus in FIG. 9 further includes the adjusting signal output section 205 connected with the non-apply points J2 and J4 of the delay lines 41 and 42 in adjusting the skew. That is, the skew adjusting apparatus connects the terminator 50 with the non-apply points J2 and J4 of the delay lines 41 and 42 in testing the outside device and connects the adjusting signal output section 205, instead of the terminator 50, with the non-apply points J2 and J4 of the delay lines 41 and 42 in adjusting the skew.

The adjusting signal output section 205 inputs an adjusting differential signal to the non-apply point J2 of the delay line 41 and the non-apply point J4 of the delay line 42 in a state in which the outside device is not connected with the outside transmission line. The adjusting signal output section 205 can output a signal substantially having no skew between the positive-side and negative-side differential signals as the adjusting differential signal of the skew adjusting apparatus in the present embodiment.

The adjusting signal output section 205 has an adjusting signal generating section 210, a positive-side variable delay circuit 220, a negative-side variable delay circuit 230, a positive-side driver 240, a negative-side driver 250 and a delay adjusting section 260. The adjusting signal generating section 210 generates the adjusting signal such as a rising pulse in a state in which the adjusting signal output section 205 is connected with the non-apply points J2 and J4 of the delay lines 41 and 42. Each of the positive-side variable delay circuit 220 and the negative-side variable delay circuit 230 delays the adjusting signal for a desirable period of time with a range of delay time that can be set. The positive-side driver 240 outputs a positive-side adjusting differential signal based on the adjusting signal delayed by the positive-side variable delay circuit 220. The negative-side driver 250 outputs a negative-side adjusting differential signal based on the adjusting signal delayed by the negative-side variable delay circuit 230. For example, the positive-side driver 240 amplifies and outputs the adjusting signal of the rising pulse and the negative-side driver 250 amplifies and outputs a signal obtained by inverting the adjusting signal of the rising pulse. It is noted that the driver DR1, the driver DR2, the variable delay circuit connected with the driver DR1 and the variable delay circuit connected with the driver DR2 within FIG. 5 provided for inputting the differential signals to the semiconductor device-under test 10 may be utilized as the positive-side driver 240, the negative-side driver 250, the positive-side variable delay circuit 220 and the negative-side variable delay circuit 230 within the adjusting signal output section 205.

The delay adjusting section 260 adjusts values of delay of the positive-side variable delay circuit 220 and the negative-side variable delay circuit 230 based on the result obtained when the adjusting differential signal is taken into the predetermined differential comparator 20 and substantially zeros the skew between the positive-side differential signal and the negative-side differential signal outputted out of the adjusting signal output section 205.

The skew adjusting method by means of the skew adjusting apparatus in FIG. 9 has a step of adjusting the adjusting signal output section 205 and a step of determining the differential comparator 20 as a selection step for selecting the signal taken in by the differential comparator 20 where the skew between the positive-side path from the output terminal of the positive-side differential signal in the outside device to the differential comparator 20 and the negative-side path from the output terminal of the negative-side differential signal in the outside device to the differential comparator 20 becomes least.

In the step of adjustment of the adjusting signal output section 205, the adjusting signal output section 205 outputs the adjusting differential signal to the delay lines 41 and 42 at first. Next, based on the result obtained when the differential comparator 20 connected with the center junctions 41-C and 42-C takes in a positive-side adjusting differential signal and a negative-side adjusting differential signal based on the adjusting signal, the delay adjusting section 260 adjusts the value of delay of the positive-side variable delay circuit 220 and the negative-side variable delay circuit 230. Here, the wiring length to the differential comparator 20 connected with the center junctions 41-C and 42-C from the positive-side driver 240 is almost equal with the wiring length from the negative-side driver 250. Accordingly, it is possible to substantially zero the skew between the positive-side differential signal and the negative-side differential signal outputted out of the adjusting signal output section 205 by adjusting the delay time of the positive-side variable delay circuit 220 and the negative-side variable delay circuit 230 by the delay adjusting section 260 so that the phases of the positive-side adjusting differential signal and the negative-side adjusting differential signal outputted based on the adjusting signal of identical pulse become almost identical at the differential comparator 20.

Then, in the step for outputting the adjusting signal, the adjusting signal output section 205 inputs the adjusting differential signal to the non-apply point J2 of the delay line 41 and the non-apply point J4 of the delay line 42 in a state in which the outside device is not connected with the outside transmission line. Because the side of the outside device in the outside transmission line is open-ended, the adjusting differential signal reflects at the end and a reflected wave is inputted from the input ends of the delay lines 41 and 42.

Next, in a determination step for determining the differential comparator 20 to be used in the test of the outside device, the selection control section 110 within the selecting section 43 selects a set of a positive-side junction and a negative-side junction that minimizes the skew in testing the outside device and determines the differential comparator 20 to be used in the test based on the adjusting differential signal inputted from the adjusting signal output section 205 and reflected from the end to which the outside device in the outside transmission line is to be connected. For instance, when the negative-side transmission line on the outside is longer than the positive-side transmission line and its propagation time is great by te, a skew of 2te occurs because the adjusting differential signal outputted out of the adjusting signal output section 205 reciprocates the outside transmission lines and is taken into the differential comparator 20. Then, the selection control section 110 determines the differential comparator 20 where the positive-side and negative-side phases of the reflected adjusting differential signal become almost identical. Then, the selection control section 110 determines the differential comparator 20 located at the middle between the differential comparator 20 and the differential comparator 20 connected with the center junctions 41-C and 42-C as the differential comparator to be used in the test. Thereby, the selection control section 110 can determine the differential comparator 20 that adjusts the skew of the negative-side transmission line to the positive-side transmission line by te on the side of the skew adjusting apparatus. Then, the selection control section 110 sets the selector 100 so s to select the signal taken in by the differential comparator 20.

Thereby, the skew adjusting apparatus can select the differential comparator 20 that minimizes the skew produced in the outside transmission lines used for connecting the outside device with the input ends of the delay lines 41 and 42. Then, the outside device to be measured is connected to propagate the differential signals inputted from the apparatus through the delay lines 41 and 42. The skew adjusting apparatus then causes the plurality of differential comparators 20 to take in the positive-side differential signal and the negative-side differential signal and to output the detection signal. Thereby, the skew adjusting apparatus can minimize the skew in the path from the output end of the outside device to the differential comparator 20 and can adequately measure the differential signal outputted out of the apparatus.

Seventh Embodiment

A seventh embodiment presents an example of the test apparatus for testing the semiconductor device-under test 10 by using the skew adjusting apparatus of the first through fourth embodiments.

Figure 10:
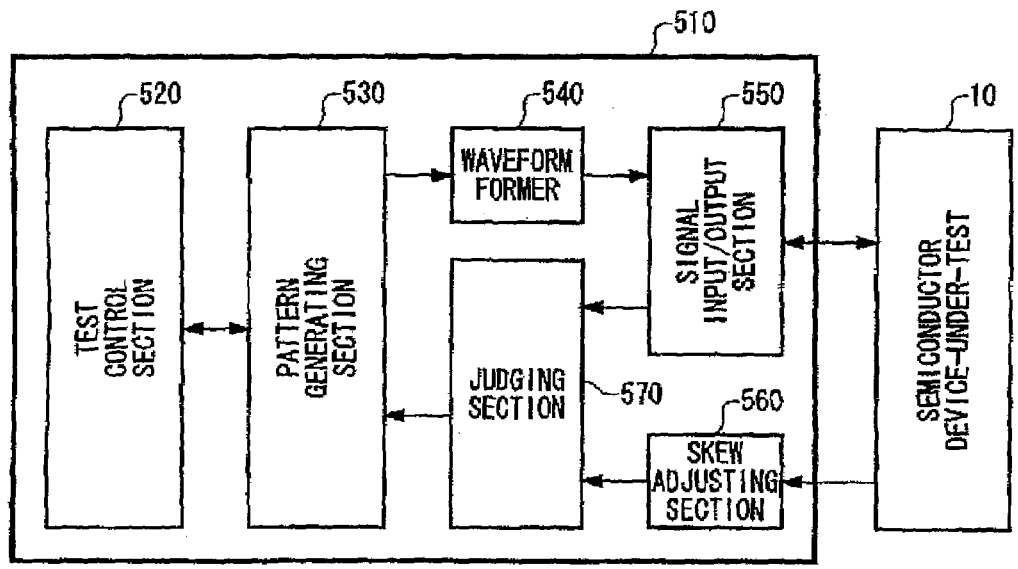
FIG. 10 is a diagram of connection for explaining a sixth embodiment of the invention.
Figure 11:
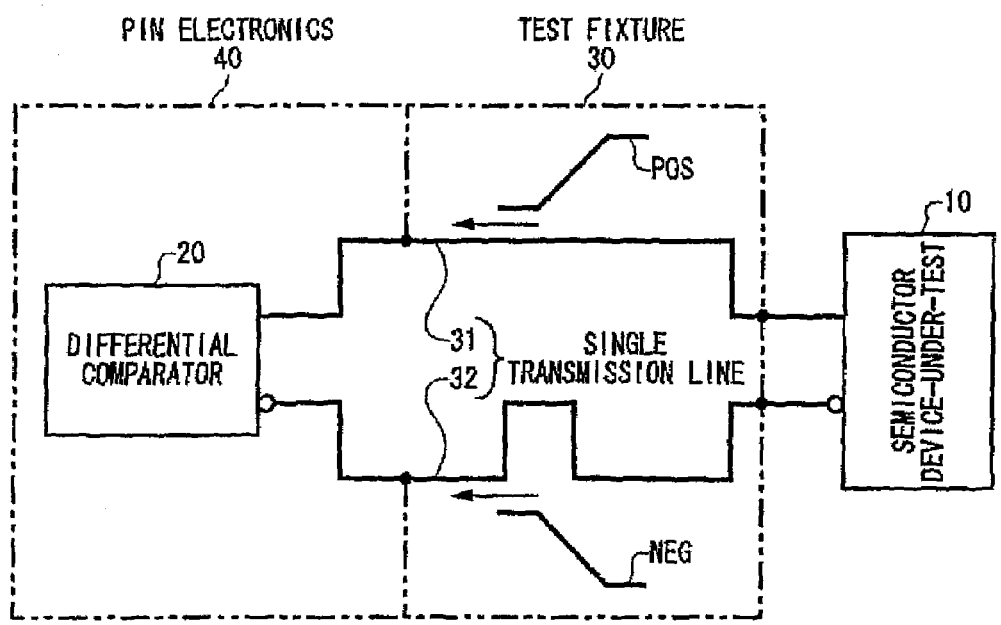
FIG. 11 is a block diagram for explaining a prior art.
Figure 12:
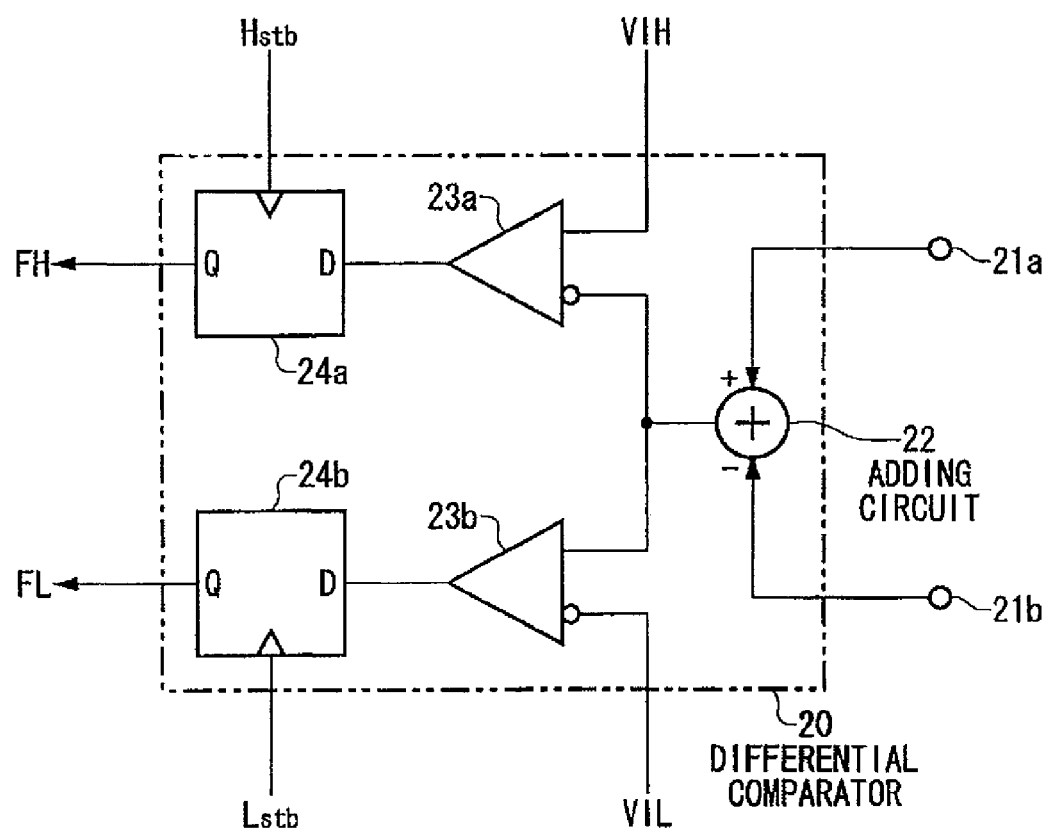
FIG. 12 is a diagram of connection for explaining a configuration of a differential comparator used in the prior art.

FIG. 10 shows a configuration of a test apparatus 510 of the present embodiment. The test apparatus 510 inputs a test signal based on a test pattern for testing the semiconductor device-under test 10 to the semiconductor device-under test 10 and judges whether or not the semiconductor device-under test 10 is defect-free based on an output signal outputted out of the semiconductor device-under test 10 corresponding to the test signal.

The test apparatus 510 has a test control section 520, a pattern generator 530, a waveform shaper 540, a signal input/output section 550, a skew adjusting section 560 and a judging section 570. The test control section 520 controls the test of the semiconductor device-under-test 10. The pattern generator 530 executes a sequence of the test program based on an instruction of the test control section 520 and generates the test pattern to be supplied to the semiconductor device-under test 10. The waveform shaper 540 receives and forms the test pattern and generates the test signal to be supplied to the semiconductor device-under test 10. That is, the waveform shaper 540 outputs a specified signal waveform to the signal input/output section 550 with timing specified by the test pattern. The signal input/output section 550 is an example of a signal outputting section of the invention and supplies the test signal to the semiconductor device-under test 10. The signal input/output section 550 also inputs the output signal outputted out of the semiconductor device-under test 10 corresponding to the test signal. The skew adjusting section 560 has almost same functions and configuration with the skew adjusting apparatus in the first through fourth embodiments. That is, it inputs the differential signal outputted out of the semiconductor device-under test 10 via the transmission lines and adjusts the skew between the positive-side differential signal and the negative-side differential signal in the differential signal. The judging section 570 judges whether or not the semiconductor device-under test 10 is defect-free based on the differential signal inputted by the skew adjusting section 560.

The embodiment described above allows the differential signal whose delay time changes in the ascending order and the differential signal whose delay time changes in the descending order to be obtained from the two delay lines. Then, it becomes possible to obtain the differential signal having an adequate phase by appropriately selecting a set of the differential signal whose delay time changes in the ascending order and the differential signal whose delay time changes in the descending order.

That is, when the differential signals having no skew are given to the two delay lines, a differential signal having no skew can be obtained by utilizing the differential signals obtained at the junctions provided at the center of the two delay lines.

When differential signals having a skew are inputted, it is possible to cancel the skew by selecting a junction at location biased to either one end from the center junction corresponding to a state of the skew. That is, according to the invention, it is possible to adjust the skew just by selecting the junction for taking out the signal from the delay lines. Therefore, the invention provides a merit that the adjustment of skew may be simply carried out. Still more, because the skew adjusting apparatus may be composed of the two delay lines, the plurality of differential comparators connected with the two delay lines and the selecting section for selecting an output of judgment of the differential comparators, it is possible to provide the simple and low cost apparatus.

Still more, because the skew adjusting apparatus can differentially adjust the delay time of either the positive-side and negative-side differential signals, it always brings about the adequate skew adjustment result even if the phase of the positive-side and negative-side differential signals is advanced or delayed.

Still more, the test apparatus 510 of the present embodiment can adequately measure the differential signals outputted out of the semiconductor device-under test 10 by canceling the skew generated in the transmission lines used in the connection with the semiconductor device-under test 10.

Although the invention has been described by way of the exemplary embodiments, it should be understood that those skilled in the art might make many changes and substitutions without departing from the spirit and scope of the invention. It is obvious from the definition of the appended claims that the embodiments with such modifications also belong to the scope of the invention.

Since the skew adjusting method and the skew adjusting apparatus can simply carry out the adjustment of skew and its configuration is simple, it may be utilized by building into the test apparatus for testing semiconductor devices.

What is claimed is:

1. A skew adjusting apparatus for adjusting a skew between a positive-side differential signal and a negative-side differential signal in differential signals inputted from an outside device via outside transmission lines; comprising:

a positive-side transmission line for propagating said positive-side differential signal inputted to an input end;

a negative-side transmission line for propagating said negative-side differential signal inputted to an input end;

a plurality of differential comparators connected with said positive-side and negative-side transmission lines so that a positive wiring length from the input end of said positive-side transmission line to one of the differential comparators and a negative wiring length from the input end of said negative-side transmission line to the one of the differential comparators are different from each other, the plurality of differential comparators receiving said positive-side differential signal and said negative-side differential signal; and a selecting section for selecting a signal outputted by said differential comparators by which a skew between the positive-side line from an output terminal of said positive-side differential signal in said outside device to the one of said differential comparators and the negative-side line from an output terminal of said negative-side differential signal in said outside device to the one of said differential comparators is minimized, wherein the positive-side transmission line comprises the input end, which is to be connected to the outside device and receives differential signals from the outside device, and a non-input end which is another end of the positive-side transmission line and receives no differential signals from the outside device, and the negative-side transmission line comprises the input end which is to be connected to the outside device and receives differential signals from the outside device and a non-input end which is another end of the negative-side transmission line and receives no differential signals from the outside device, the skew adjusting apparatus further comprising an adjusting signal output section for supplying an adjusting differential signal to the non-input end of said positive-side transmission line and to the non-input end of said negative-side transmission line, wherein the selecting section selects a combination of said positive-side junction and said negative-side junction that minimize said skew based on said adjusting differential signal reflected from end pads of the outside transmission lines, wherein the outside device is to be connected to the end parts.

2. The skew adjusting apparatus as set forth in claim 1, characterized in that a plurality of positive-side junctions to which wiring lengths from said input end differ are provided on said positive-side transmission line; a plurality of negative-side junctions to which wiring lengths from said input end differ are provided on said negative-side transmission line; and each of said differential comparators takes in said positive-side differential signal and said negative-side differential signal from said positive-side junctions and said negative-side junctions corresponding to the positive-side junctions.

3. The skew adjusting apparatus as set forth in claim 1, characterized in that each of said plurality of positive-side junctions arrayed in order of those having shorter wiring length from said input end and each of said plurality of negative-side junctions arrayed in order of those having longer wiring length from said input end correlate in a relationship of 1-to-1 in the order of array; each of said plurality of differential comparators is connected with said positive-side junction and said negative-side junction; and said selecting section selects outputs from one of said differential comparator where said skew becomes least among said plurality of differential comparators to receive said differential signal.

4. The skew adjusting apparatus as set forth in claim 3, characterized in that said plurality of positive-side junctions and said plurality of negative-side junctions are provided at predetermined intervals on said positive-side transmission line and on said negative-side transmission line.

5. The skew adjusting apparatus as set forth in claim 4, characterized in that said positive-side transmission line and said negative-side transmission line are provided almost in parallel so as to transmit said positive-side differential signal and said negative-side differential signal in the opposite direction; and said corresponding positive-side junction and negative-side junction are provided at almost a same position in the direction in which said positive-side transmission line and said negative-side transmission line extend.

6. The skew adjusting apparatus as set forth in claim 3, characterized in that said selecting section selects outputs from one of said differential comparators where said skew is minimized based on said differential signal received by each of said plurality of differential comparators.

7. The skew adjusting apparatus as set forth in claim 1, characterized in that said adjusting signal output section has:
an adjusting signal generating section for generating an adjusting signal;
a positive-side variable delay circuit and a negative-side variable delay circuit for delaying said adjusting signal by desirable time;
a positive-side driver for outputting said positive-side adjusting differential signal based on said adjusting signal delayed by said positive-side variable delay circuit;
a negative-side driver for outputting said negative-side adjusting differential signal based on said adjusting signal delayed by said negative-side variable delay circuit; and
a delay adjusting section for adjusting a value of delay of said positive-side variable delay circuit and said negative-side variable delay circuit based on a result when said positive-side adjusting differential signal and said negative-side adjusting differential signal based on said adjusting signal are taken in by said differential comparator, wherein a wiring length from said positive-side driver to the differential comparator is almost equal with a wiring length from said negative-side driver to the differential comparator.

8. A skew adjusting method for adjusting a skew between a positive-side differential signal and a negative-side differential signal in differential signals inputted from an outside device via outside transmission lines; comprising:
a step of positive-side transmission for propagating said positive-side differential signal inputted to an input end by a positive-side transmission line;
a step of negative-side transmission for propagating said negative-side differential signal inputted to an input end by a negative-side transmission line;
a step of taking in said positive-side differential signal and said negative-side differential signal by a plurality of differential comparators connected with said positive-side and negative-side transmission lines so that a wiring length from the input end of said positive-side transmission line to one of the plurality of differential comparators and a wiring length from the input end of said negative-side transmission line to the one of the plurality of differential comparators is different from each other; and
a step of selection for selecting a signal outputted by said differential comparator by which a skew between a positive-side path from an output terminal of said positive-side differential signal in said outside device to said differential comparator and a negative-side path from an output terminal of said negative-side differential signal in said outside device to said differential comparator is minimized,
wherein the step of selection includes:
a step of inputting an adjusting differential signal substantially having no skew between a positive-side differential signal and a negative-side differential signal of the adjusting differential signal to end parts of the outside transmission lines, wherein the outside device is to be connected to the end parts; and
a step of selecting one of said differential comparators where said skew becomes least based on said adjusting differential signal obtained by each of said plurality of differential comparators.

9. The skew adjusting method as set forth in claim 8, further includes a adjusting signal outputting step for inputting an adjusting differential signal to a non-input end of said positive-side transmission line and to a non-input end of said negative-side transmission line in a state in which said outside device is not connected with said outside transmission lines; and a set of said positive-side junction and said negative-side junction that minimize said skew is selected in said selection step based on said adjusting differential signal reflected from the end parts to which said outside device in said outside transmission line is to be connected.

10. The skew adjusting method as set forth in claim 8, wherein differential signals outputted out of the outside device are applied to each one end of two delay lines, a plurality of junctions in ascending order for taking out differential signals whose delay time changes in an ascending order from an apply point is provided on one of the two delay lines, a plurality of junctions in descending order for taking out differential signals whose delay time changes in a descending order from a non-apply point is provided on the other delay line and a differential signal having an adequate phase is extracted from the set of those plurality of junctions in ascending order and the plurality of junctions in descending order.

11. The skew adjusting method as set forth in claim 10, characterized in that said two delay lines are disposed in parallel from each other, the apply point of said differential signal of one delay line is disposed at one end of said two parallel delay lines, the apply point of said differential signal of the other delay line is disposed on the other end, junctions in ascending order for taking out a plurality of differential signals in which delay time increases in ascending order per predetermined distance from the aspect of the apply point of one differential signal are provided, descending junctions are provided on the other delay line closely with each one of the ascending junctions and the ascending junction and the descending junction set closely from each other are utilized as a pair for taking out the differential signals.

12. A test apparatus for testing a semiconductor device-under test, comprising:
    a pattern generator for generating a test pattern of said semiconductor device-under test;
    a waveform shaper for generating a test signal to be supplied to said semiconductor device-under test by forming said test pattern;
    a signal output section for supplying said test signal to said semiconductor device-under test;
    a skew adjusting section for inputting differential signals outputted out of said semiconductor device-under test via transmission lines to adjust a skew between a positive-side differential signal and a negative-side differential signal in said differential signal; and
    a judging section for judging whether said semiconductor device-under test is defect-free based on said differential signal inputted by said skew adjusting section, wherein the skew adjusting section includes:
        a positive-side transmission line for propagating said positive-side differential signal inputted to the input end;
        a negative-side transmission line for propagating said negative-side differential signal inputted to the input end;
        a plurality of differential comparators that is connected to said positive-side and negative-side transmission lines so that a wiring length from the input end of said positive-side transmission line to one of the plurality of differential comparators and a wiring length from the input end of said negative-side transmission line to the one of the plurality of the differential comparators are different from each other and that takes in said positive-side differential signal and said negative-side differential signal; and
        a selecting section for selecting a signal taken in by said differential comparator where the skew between the negative-side path from an output terminal of said positive-side differential signal in said semiconductor device-under test to said differential comparator and the negative-side path from the output end of said negative-side differential signal in said outside device to said differential comparator is minimized,
    wherein the positive-side transmission line comprises the input end, which is to be connected to the outside device and receives differential signals from the outside device, and a non-input end which is another end of the positive-side transmission line and receives no differential signals from the outside device, and the negative-side transmission line comprises the input end which is to be connected to the outside device and receives differential signals from the outside device and a non-input end which is another end of the negative-side transmission line and receives no differential signals from the outside device,
    the skew adjusting apparatus further comprising an adjusting signal output section for supplying an adjusting differential signal to the non-input end of said positive-side transmission line and to the non-input end of said negative-side transmission line,
    wherein the selecting section selects a combination of said positive-side junction and said negative-side junction that minimize said skew based on said adjusting differential signal reflected from end parts of the outside transmission lines, wherein the outside device is to be connected to the end parts.

13. A skew adjusting apparatus, comprising:
    two delay lines to which differential signals outputted out of a semiconductor device-under test are applied;
    a plurality of junctions in ascending order, provided per predetermined distance from an apply point of said differential signal on one of said two delay lines, for taking out differential signals in which delay time of said differential signals increases in ascending order from said apply point;
    a plurality of junctions in descending order, provided per predetermined distance from a non-apply point of said differential signal on the other delay line, for taking out differential signals in which delay time of said differential signals decreases in descending order from said apply point;
    a plurality of differential comparators for taking in the differential signal from each one of the plurality of junctions in ascending order and the plurality of junctions in descending order correlated from each other; and
    a selecting section for selecting a judgment result out of judgment results outputted out of said plurality of differential comparators,
    wherein the respective delay lines comprises an input end, which is to be connected to the semiconductor device under test and receives differential signals from the semiconductor device under test, and a non-input end which is another end of the respective delay lines and receives no differential signals from the semiconductor device-under-test,
    the skew adjusting apparatus further comprising an adjusting signal output section for supplying an adjusting differential signal to the non-input ends of the delay lines,
    wherein the selecting section selects a pair of junctions on the delay lines that minimize said skew based on said adjusting differential signal reflected from end parts of the delay lines, wherein the semiconductor device under test is to be connected to the end parts.

14. The skew adjusting apparatus as set forth in claim 13, characterized in that said two delay lines are disposed in parallel from each other, the apply point of said differential signal of one delay line is disposed at one end of said two parallel delay lines, the non-apply point of the differential signal of the other delay line is disposed on the other end closely with the apply point of the differential signal, junctions in ascending order for taking out differential signals in which delay time increases in ascending order per predetermined distance from the aspect of the apply point and the non-apply point of those differential signals are provided, descending junctions are provided on the other delay line closely with the ascending junctions and the ascending junction and the descending junction are correlated as a pair.

* * * * *

UNITED STATES PATENT AND TRADEMARK OFFICE
CERTIFICATE OF CORRECTION

PATENT NO. : 7,397,289 B2
APPLICATION NO. : 11/501474
DATED : July 8, 2008
INVENTOR(S) : Shoji Kojima It is certified that error appears in the above-identified patent and that said Letters Patent is hereby corrected as shown below:

In Claim 1, column 17, line 7, the word "pads" should be --pa<u>r</u>ts--.

Signed and Sealed this

Thirtieth Day of September, 2008

JON W. DUDAS
*Director of the United States Patent and Trademark Office*